US007784970B2

(12) United States Patent
Sun

(10) Patent No.: US 7,784,970 B2
(45) Date of Patent: Aug. 31, 2010

(54) HEAT DISSIPATING STRUCTURE OF LIGHT SOURCE UTILITY

(75) Inventor: Tsung-Ting Sun, Chung-Ho (TW)

(73) Assignee: Edison Opto Corporation, Taipei (TW)

( * ) Notice: Subject to any disclaimer, the term of this patent is extended or adjusted under 35 U.S.C. 154(b) by 584 days.

(21) Appl. No.: 11/730,401

(22) Filed: Apr. 2, 2007

(65) Prior Publication Data

US 2008/0211370 A1 Sep. 4, 2008

(30) Foreign Application Priority Data

Mar. 1, 2007 (TW) .............................. 96203397 U

(51) Int. Cl.
*F21V 29/00* (2006.01)
*H01J 7/24* (2006.01)
*H05K 7/20* (2006.01)

(52) U.S. Cl. .................. 362/294; 362/249.02; 362/345; 362/373; 362/646; 361/719

(58) Field of Classification Search ............ 362/249.02, 362/294, 345, 373, 646; 361/719
See application file for complete search history.

(56) References Cited

U.S. PATENT DOCUMENTS 6,788,541 B1 * 9/2004 Hsiung ....................... 361/719
7,101,061 B2 * 9/2006 Nagai et al. ................. 362/294
7,175,329 B1 * 2/2007 Chou ......................... 362/612
7,434,977 B2 * 10/2008 Fukasawa et al. ........... 362/631
2003/0189829 A1 * 10/2003 Shimizu et al. ............. 362/240

* cited by examiner

*Primary Examiner*—Stephen F Husar
*Assistant Examiner*—James W Cranson
(74) *Attorney, Agent, or Firm*—Rosenberg, Klein & Lee

(57) ABSTRACT

The present invention discloses a heat dissipating structure of a light source utility that includes a rear-located heat dissipating element, a light source generating element, a thermally conductive mounting element and a front-located heat dissipating element. The rear-located heat dissipating element has a first surface, and a light source generating element arranged on the first surface. The thermally conductive mounting element is arranged around the light source generating element on the first surface. The front-located heat dissipating element is arranged on the thermally conductive mounting element, and has at least one hole corresponding to the light source generating element. The heat generated from the light source generating element is conducted to the rear-located heat dissipating element, and the thermally conductive mounting element further conducts the heat to the front-located heat dissipating element for heat dissipation.

11 Claims, 17 Drawing Sheets

HEAT DISSIPATING STRUCTURE OF LIGHT SOURCE UTILITY

BACKGROUND OF THE INVENTION

1. Field of the Invention

The present invention relates to a heat dissipating structure of a light source utility, and more particularly to a heat dissipating structure capable of conducting the heat generated from the light source utility to a front-located heat dissipating element of a light source utility for efficient heat dissipation.

2. Description of the Related Art

Light emitting diodes (LEDs) are extensively applied to various applications including light source utility. Since watt-level LED is developed to provide higher efficient ability, heat generated from the watt-level LED increases accordingly and indirectly causes a drastic temperature increase of the light source utility. Furthermore, the performance and lifetime of LEDs will be degraded if the temperature exceeds a certain acceptable level.

The conventional LED light source utility simply adopts the air conduction method to remove internal heat, or installs a heat sink or a fan at the rear side of the LED (as disclosed in R.O.C. Pat. Publication No. 200608595) as a solution for the heat dissipation. However, the heat dissipating speed of air conduction is too slow to dissipate heat well, and the installation of the heat sink will increase the overall volume of the light source utility and limit the applications of the light source utility.

Meanwhile, it is inappropriate to dissipate heat from the rear side of a light source for the applications of a light source utility such as a flashlight. Because a battery is arranged at the rear side of the light source of the flashlight, no room is available for installing the aforementioned heat sink. Alternatively, the rear side of some light source utilities has a waterproof design which is made of a plastic material, and thus the installation of a heat sink at the rear side of the light source utility of this sort is inappropriate because plastic is a poor thermal conductor.

Therefore, it is an important issue to reduce the volume occupied by a light source utility while providing a good heat dissipating effect. For reducing the volume of the light source utility and maintaining a good heat dissipating effect of the light source utility, the inventor of the present invention based on years of experience on the related field to conduct extensive researches and experiments and finally developed a heat dissipating structure of a light source utility in accordance with the present invention.

SUMMARY OF THE INVENTION

The primary objective of the present invention is to overcome the foregoing drawbacks of the prior art and redesign the conventional dissipating structure of a light source utility, such that the heat generated from LED can be conducted from the rear side to the front side of the light source utility for a heat dissipation by the heat dissipating structure.

To achieve the foregoing objective, the present invention provides a heat dissipating structure of a light source utility comprising a rear-located heat dissipating element, a light source generating element, a thermally conductive mounting element and a front-located heat dissipating element. The rear-located heat dissipating element has a first surface, and the light source generating element is arranged on the first surface. The thermally conductive mounting element is arranged around the light source generating element on the first surface. The front-located heat dissipating element is arranged on the thermally conductive mounting element and has a hole corresponding to the light source generating element.

The heat generated from the light source generating element is conducted to the rear-located heat dissipating element, and the thermally conductive mounting element is provided for conducting heat from the rear-located heat dissipating element to the front-located heat dissipating element for heat dissipation.

The present invention further integrates an air flow generating element to provide another design for the heat dissipating structure of a light source utility. The heat dissipating structure of a light source utility of the present invention conducts the heat produced by the LEDs of the light source utility to the front-located of the light source utility, and also achieves the effect of increasing the heat dissipating of the light source utility.

DETAILED DESCRIPTION OF THE PREFERRED EMBODIMENTS

To make it easier for our examiner to understand the present invention, the following detailed description with reference to the accompanying drawings of embodiments are given for example, but such preferred embodiment is not intended to limit the scope of the present invention. For simplicity, like numerals are used for like elements as described in the specification of the present invention.

Figure 1:
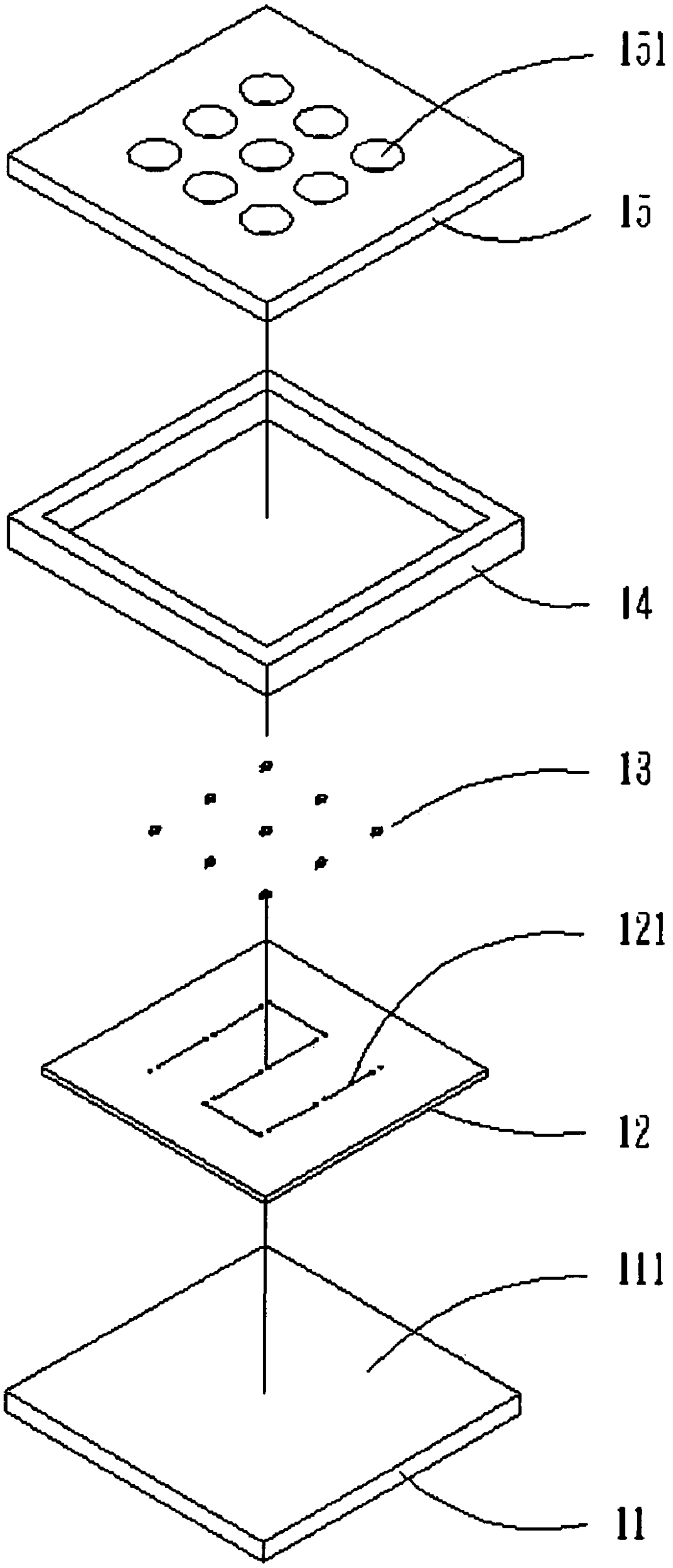
FIG. 1 is an exploded view of a heat dissipating structure of a light source utility in accordance with a first preferred embodiment of the present invention.
Figure 2:
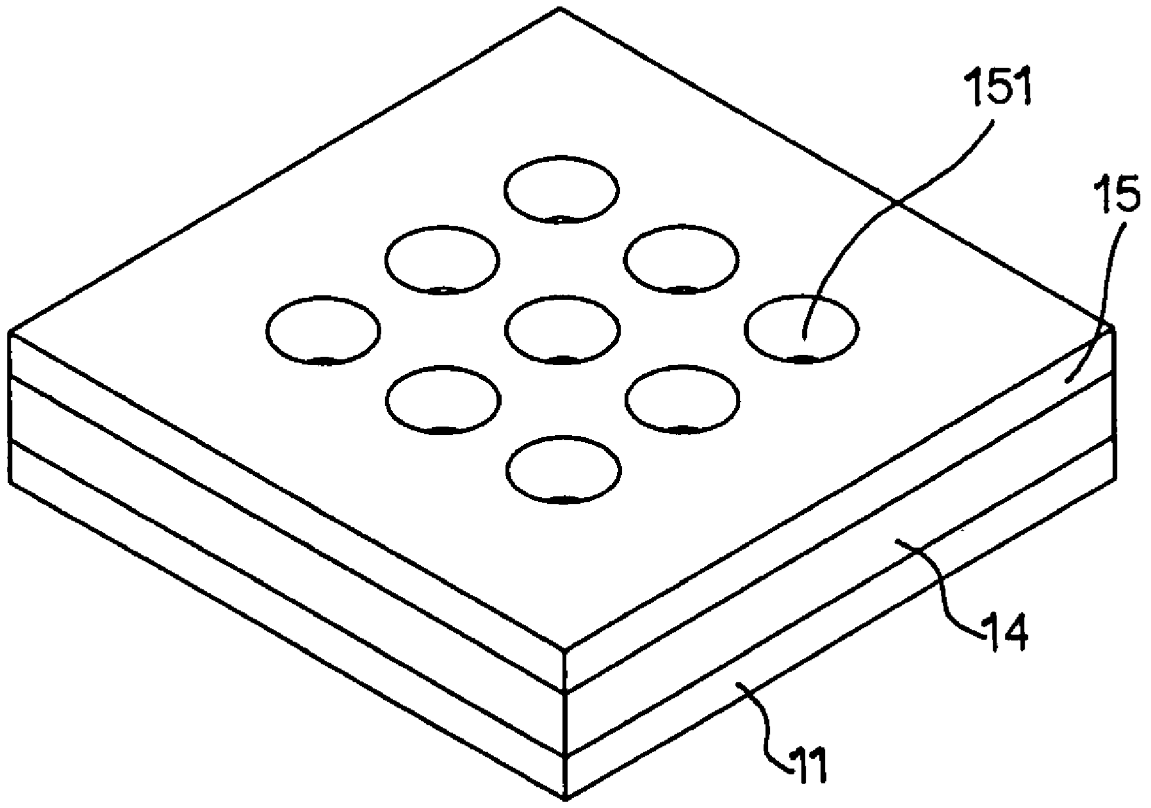
FIG. 2 is a perspective view of a heat dissipating structure of a light source utility in accordance with a first preferred embodiment of the present invention.
Figure 3:
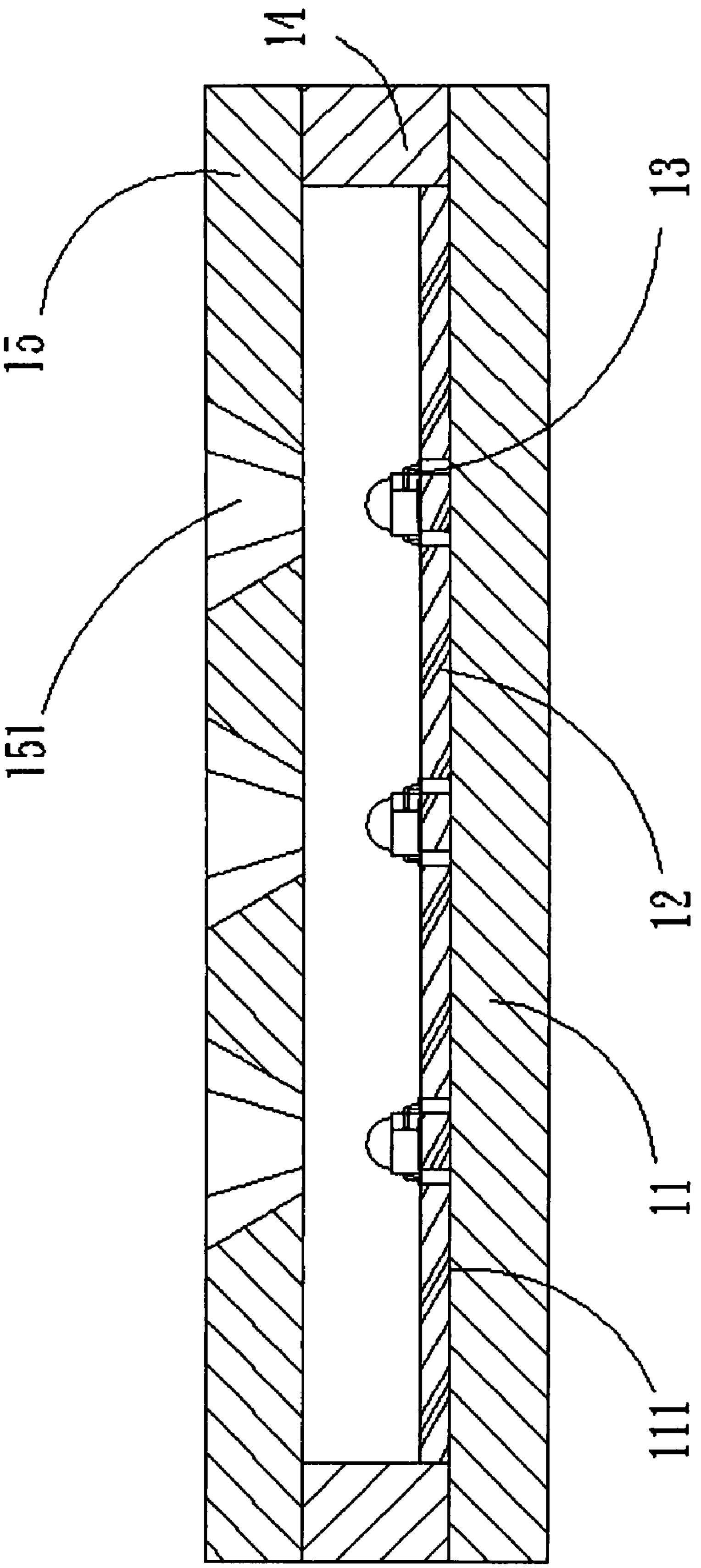
FIG. 3 is a cross-sectional view of a heat dissipating structure of a light source utility in accordance with a first preferred embodiment of the present invention.

Referring to FIGS. 1 to 3 for an exploded view, a perspective view and a cross-sectional view of a heat dissipating structure of a light source utility in accordance with a first preferred embodiment of the present invention, a light source utility 1 comprises a rear-located heat dissipating element 11, a light source generating element, a thermally conductive mounting element 14 and a front-located heat dissipating element 15.

The rear-located heat dissipating element 11 has a first surface 111, and the light source generating element is arranged on the first surface 111 of the rear-located heat dissipating element 11. The rear-located heat dissipating element 11 is made of a thermally conductive metal, and a surface of the rear-located heat dissipating element 11 can be coated with a radiating heat dissipating material to achieve the effects of radiatively dissipating heat.

The light source generating element comprises a circuit board 12 and at least one light emitting element 13. A circuitry 121 is formed on the circuit board 12 for driving the light emitting element 13, or the light emitting element 13 is built directly on the first surface 111 having the circuitry 121, wherein the light emitting element 13 is a DC light emitting diode, an AC light emitting diode, a lamp tube or a light bulb.

The thermally conductive mounting element 14 is arranged around the circuit board 12 of the light source generating element on the first surface 111 of the rear-located heat dissipating element 11. The thermally conductive mounting element 14 is made of a thermally conductive metal, and a surface of the thermally conductive mounting element 14 can be coated with a radiating heat dissipating material to achieve the effect of radiatively dissipating heat. The thermally conductive mounting element 14 is a reflector capable of reflecting light and conducting heat.

The front-located heat dissipating element 15 is arranged on the thermally conductive mounting element 14, and has at least one hole 151 corresponding to the light emitting element 13 of the light source generating element for preventing possible block of light emitted from the light emitting element 13. The front-located heat dissipating element 15 is made of a thermally conductive metal. Besides, a surface of the front-located heat dissipating element 15 can be coated with a radiating heat dissipating material to achieve the effect of radiatively dissipating heat. Further, the front-located heat dissipating element 15 can include a plurality of sub-structures for increasing a heat dissipation area. The sub-structures have a cross section of a columnar shape, a conical shape or any other shape and are arranged in a parallel alignment or a radiating alignment. In the other hand, the sub-structures can be the rough surface on the front-located heat dissipating element 15 for increasing a heat dissipation area. The rough surface is made by a sand blasting method.

The heat generated from the light emitting element 13 of the light source generating element is conducted to the rear-located heat dissipating element 11, and the rear-located heat dissipating element 11 conducts heat to the front-located heat dissipating element 15 through the thermally conductive mounting element 14 for heat dissipation. These elements constitute a light source utility 1 that can achieve the effects of dissipating heat rapidly and effectively reduce the volume of the of a light source utility, so as to overcome the drawbacks of the prior art.

Figure 4:
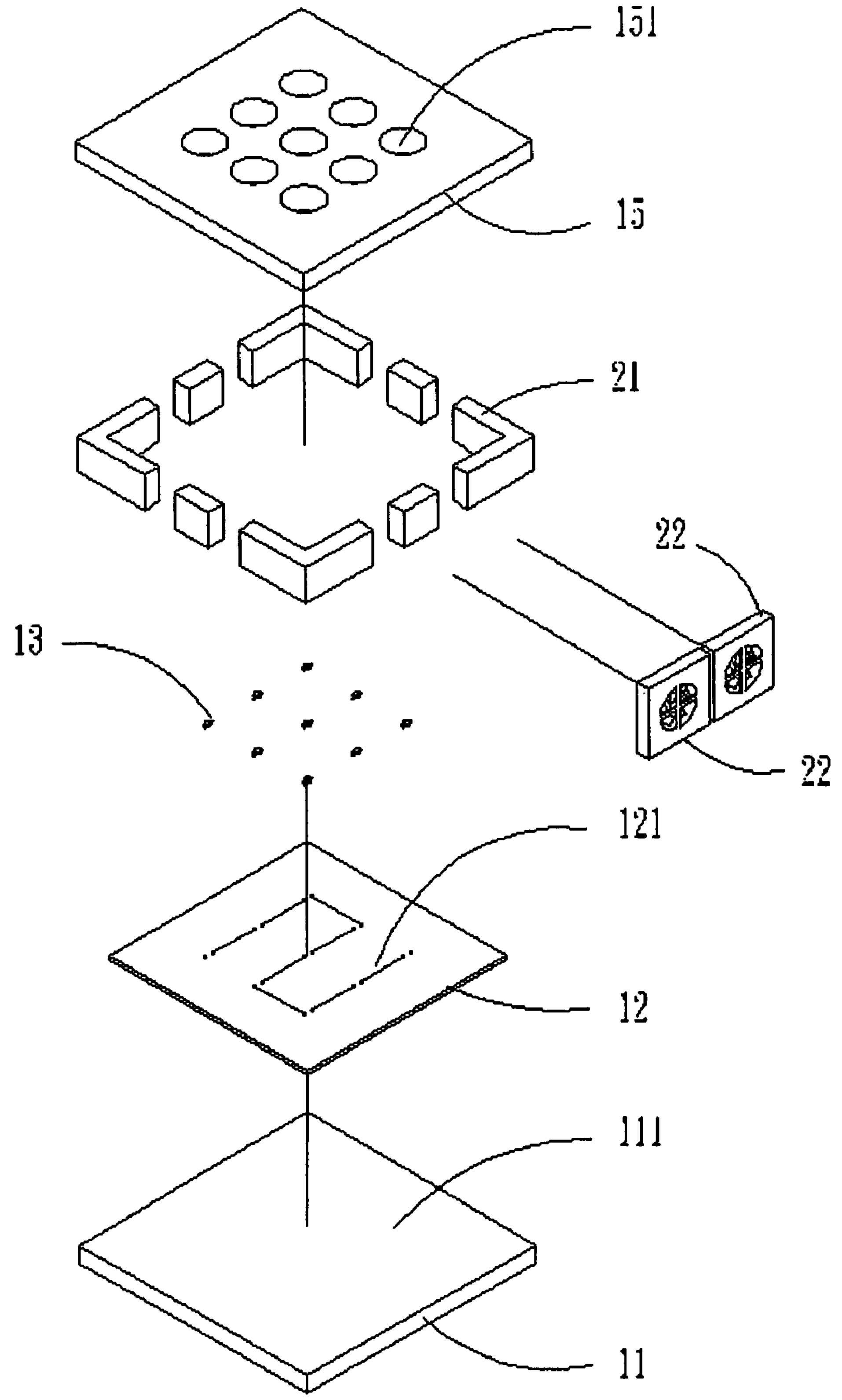
FIG. 4 is an exploded view of a heat dissipating structure of a light source utility in accordance with a second preferred embodiment of the present invention.
Figure 5:
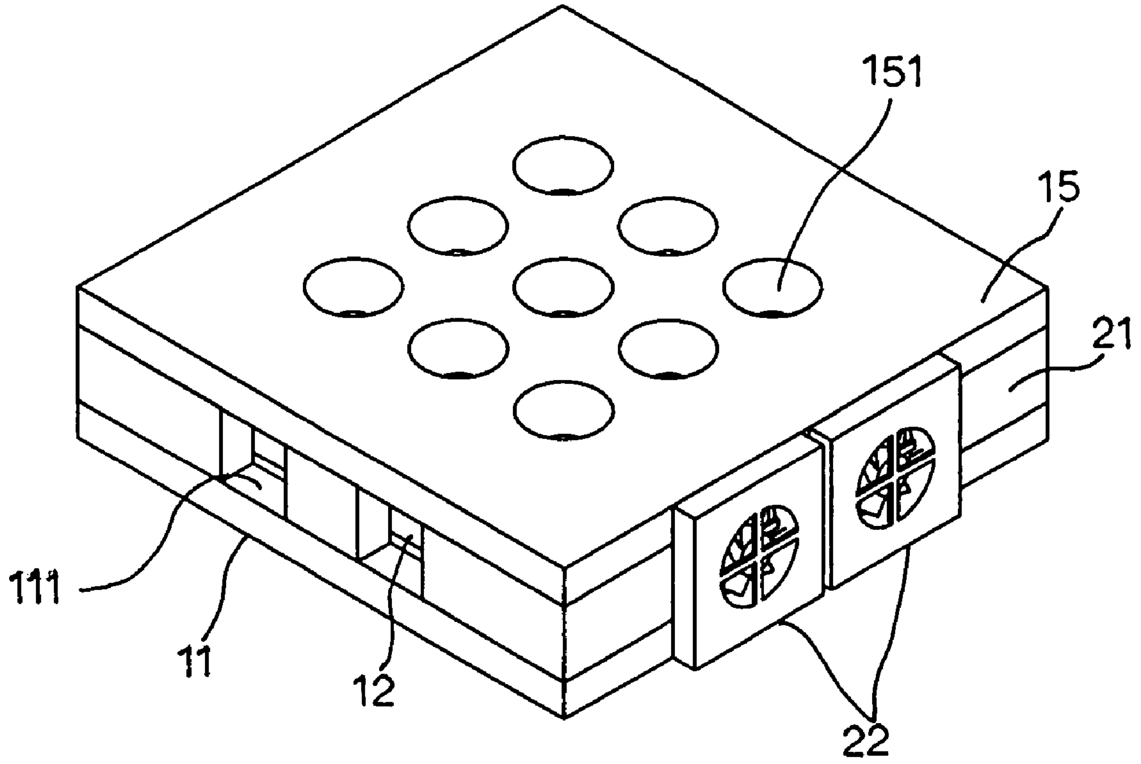
FIG. 5 is a perspective view of a heat dissipating structure of a light source utility in accordance with a second preferred embodiment of the present invention.
Figure 6:
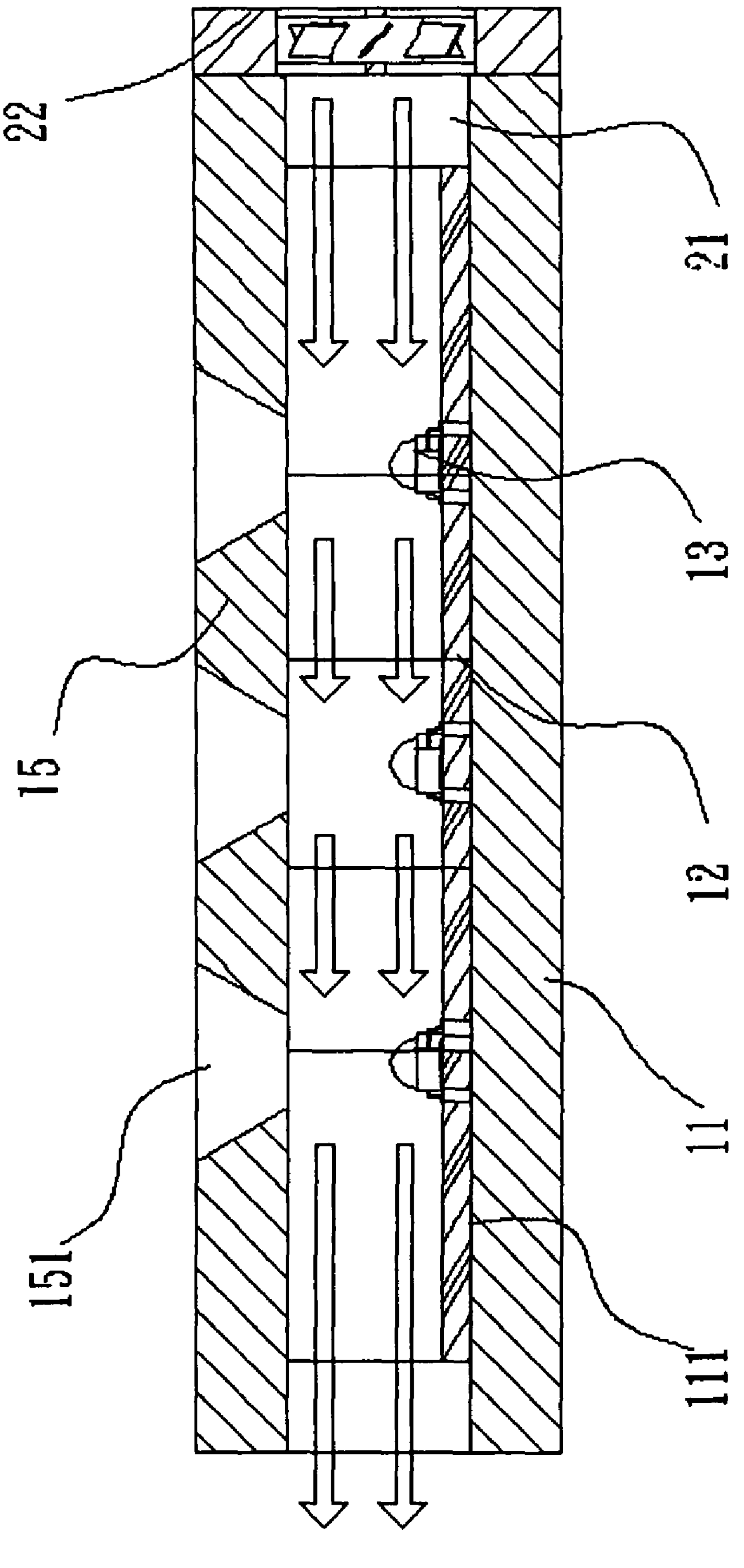
FIG. 6 is a cross-sectional view of a heat dissipating structure of a light source utility in accordance with a second preferred embodiment of the present invention.

Referring to FIGS. 4 to 6 for an exploded view, a perspective view and a cross-sectional view of a heat dissipating structure of light source utility in accordance with a second preferred embodiment of the present invention, a light source utility 2 comprises a rear-located heat dissipating element 11, a light source generating element, at least one thermally conductive mounting element 21, a front-located heat dissipating element 15 and an air flow generating element 22.

The rear-located heat dissipating element 11 has a first surface 111 and the light source generating element is arranged on the first surface 111 of the rear-located heat dissipating element 11. The rear-located heat dissipating element 11 is made of a thermally conductive metal. Besides, a surface of the rear-located heat dissipating element 11 can be coated with a radiating heat dissipating material to achieve the effects of radiatively dissipating heat.

The light source generating element comprises of a circuit board 12 and at least one light emitting element 13. A circuitry 121 is formed on the circuit board 12 for driving the light emitting element 13, or the light emitting element 13 is built directly on the first surface 111 having the circuitry 121. The light emitting element 13 can be a DC light emitting diode, an AC light emitting diode, a lamp tube or a light bulb.

A plurality of thermally conductive mounting elements 21 arranged around the circuit board 12 of the light source generating element on the first surface 111 of the rear-located heat dissipating element 11 and arranged with a gap apart from each other. The thermally conductive mounting elements 21 are made of a thermally conductive metal. Besides, a surface of the thermally conductive mounting element 21 can be coated with a radiating heat dissipating material to achieve the effect of radiatively dissipating heat. The thermally conductive mounting element 21 is a reflector capable of reflecting light and conducting heat.

The front-located heat dissipating element 15 is arranged on the thermally conductive mounting element 21, and has at least one hole 151 corresponding to the light emitting element 13 of the light source generating element for preventing possible block of light emitted from the light emitting element 13. The front-located heat dissipating element 15 is made of a thermally conductive metal. Besides, a surface of the front-located heat dissipating element 15 can be coated with a radiating heat dissipating material to achieve the effect of radiatively dissipating heat. Further, the front-located heat dissipating element 15 includes a plurality of sub-structures for increasing a heat dissipation area. The sub-structures have a cross section of a columnar shape, a conical shape or any other shape, and the sub-structures are arranged in a parallel alignment or a radiating alignment. In the other hand, the sub-structures can be the rough surface on the front-located heat dissipating element 15 for increasing a heat dissipation area. The rough surface is made by a sand blasting method.

An air flow generating element 22 is arranged between the thermally conductive mounting elements 21 and corresponds to a gap formed between the thermally conductive mounting elements 21, so that the air is driven to flow into the space between the rear-located heat dissipating element 11 and the front-located heat dissipating element 15 and then exit from the other gaps. The air flow generating element 22 can be a fan.

The heat generated from the light emitting element 13 of the light source generating element is conducted to the rear-located heat dissipating element 11, and the rear-located heat dissipating element 11 conducts heat to the front-located heat dissipating element 15 through the thermally conductive mounting element 21 for heat dissipation. The arrow shown in the figures indicates the air flowing between the rear-located heat dissipating element 11 and the front-located heat dissipating element 15, and the air flows out from the gap of the thermally conductive mounting elements 21 of the air flow generating element 22 for heat dissipation. The light source utility 2 having a heat dissipating structure can achieve the effects of dissipating heat rapidly and effectively reduce the volume of the of a light source utility, so as to overcome the drawbacks of the prior art.

Figure 7:
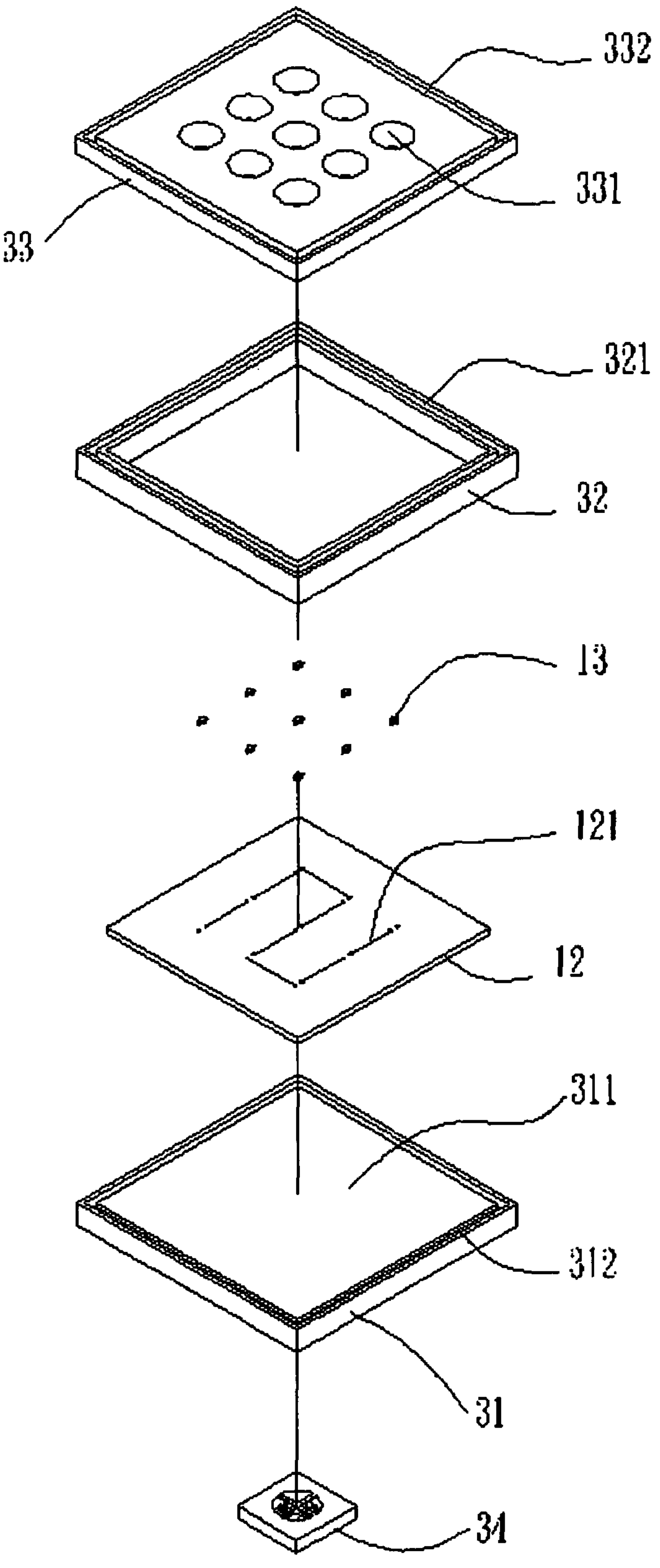
FIG. 7 is an exploded view of a heat dissipating structure of a light source utility in accordance with a third preferred embodiment of the present invention.
Figure 8:
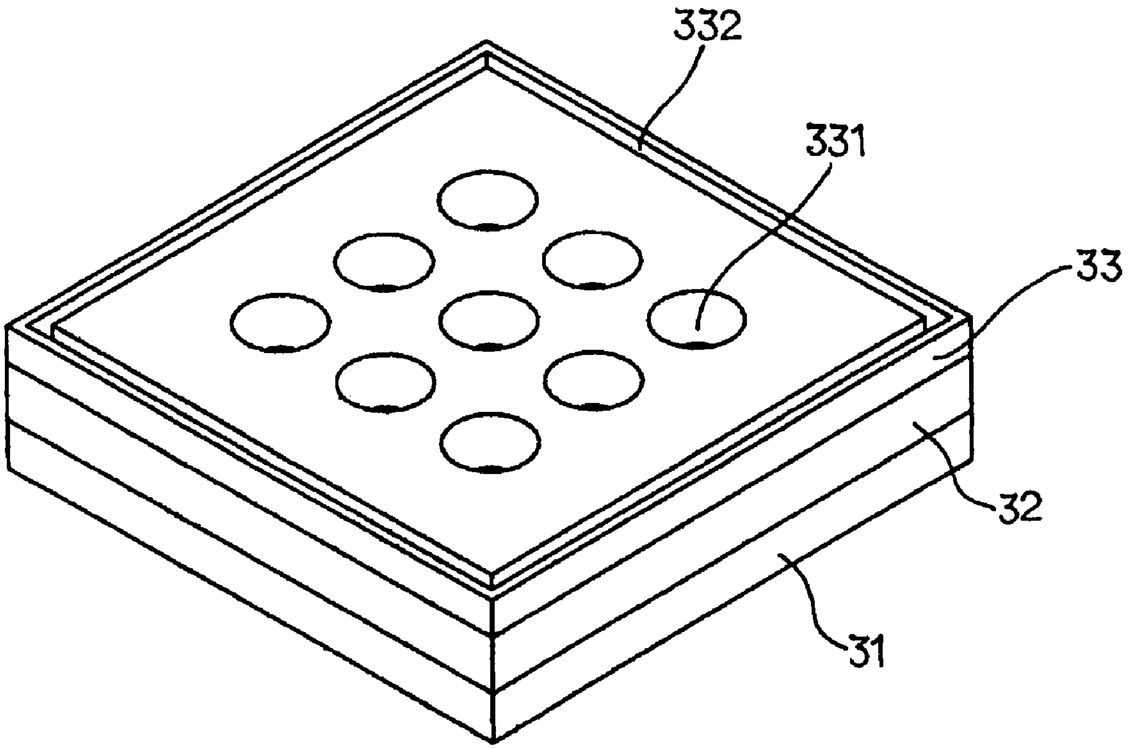
FIG. 8 is a perspective view of a heat dissipating structure of a light source utility in accordance with a third preferred embodiment of the present invention.
Figure 9:
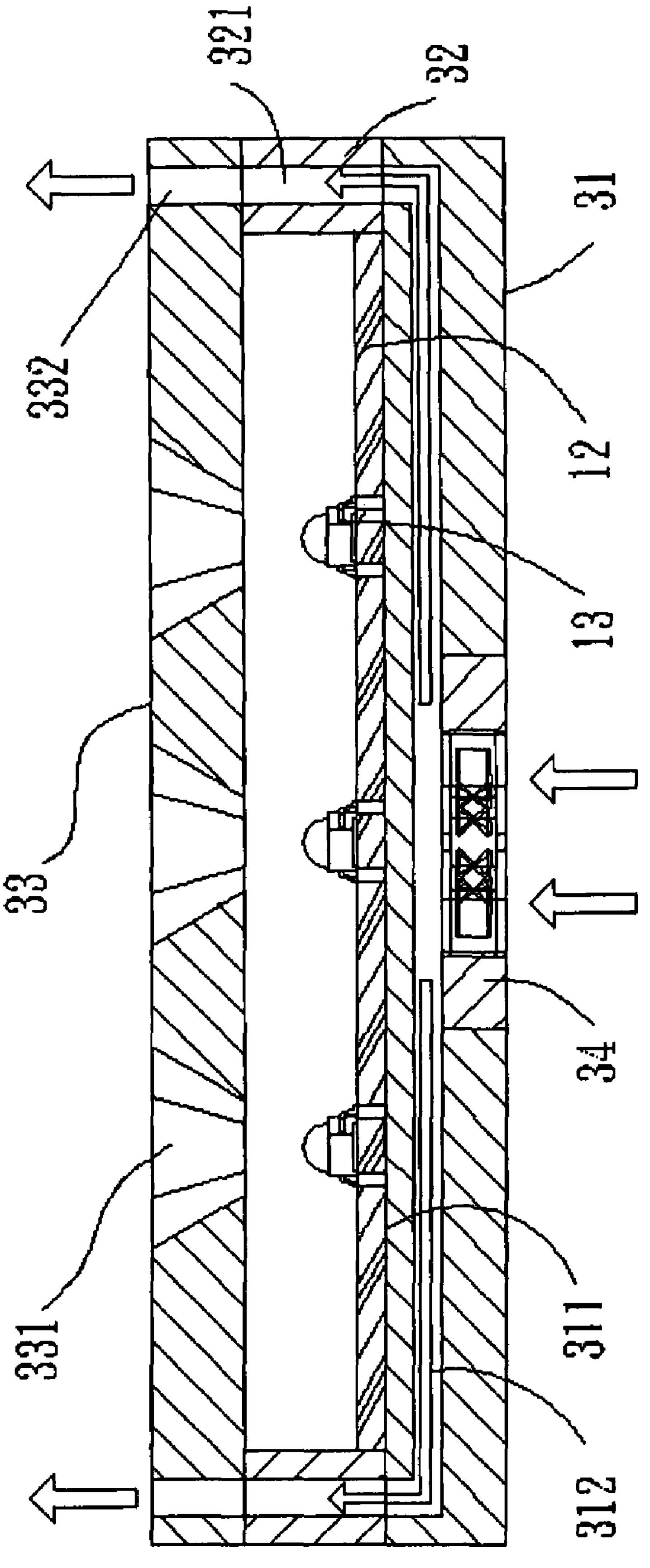
FIG. 9 is a cross-sectional view of a heat dissipating structure of a light source utility in accordance with a third preferred embodiment of the present invention.

Referring to FIGS. 7 to 9 for an exploded view, a perspective view and a cross-sectional view of a heat dissipating structure of light source utility in accordance with a third preferred embodiment of the present invention, the heat dissipating structure of a light source utility 3 comprises a rear-located heat dissipating element 31, a light source generating element, at least one thermally conductive mounting element 32, a front-located heat dissipating element 33 and an air flow generating element 34.

The rear-located heat dissipating element 31 has a first surface 311 and a first air passage 312. The light source generating element is arranged on the first surface 311 of the rear-located heat dissipating element 31. The first air passage 312 generally has a plurality partition pillars for maintaining the gap of the first air passage 312. The first air passage 312 provides a penetrating passage through the first surface 311 and the bottom of the rear-located heat dissipating element 31. The rear-located heat dissipating element 31 is made of a thermally conductive metal. A surface of the rear-located heat dissipating element 31 can be coated with a radiating heat dissipating material to achieve the effects of radiatively dissipating heat.

The light source generating element comprises a circuit board 12 and at least one light emitting element 13. A circuitry 121 is formed on the circuit board 12 for driving the light emitting element 13, or the light emitting element 13 is built directly on the first surface 111 having the circuitry 121, wherein the light emitting element 13 can be a DC light emitting diode, an AC light emitting diode, a lamp tube or a light bulb.

The thermally conductive mounting element 32 is arranged around the circuit board 12 of the light source generating element on the first surface 311 of the rear-located heat dissipating element 31 and has a second air passage 321 corresponding to the first air passage 312. The second air passage 321 generally installs a plurality of partition pillars for maintaining the gap of the second air passage 321. The thermally conductive mounting element 32 is made of a thermally conductive metal. A surface of the thermally conductive mounting element 32 can be coated with a radiating heat dissipating material to achieve the effects of radiatively dissipating heat. The thermally conductive mounting element 32 can be a reflector capable of reflecting heat and conducting heat.

The front-located heat dissipating element 33 is arranged on the thermally conductive mounting element 32 and has at least one hole 331 corresponding to the light emitting element 13 of the light source generating element and at least one hole 332 corresponding to the a second air passage 321 of the thermally conductive mounting element 32. The hole 332 of the second air passage 321 can arrange a plurality of partition pillars to maintain the gap of the hole 332 for corresponding to the second air passage 321. The holes 331 corresponding to the light emitting element 13 are provided for preventing a possible block of light emitted from the light emitting element 13. The front-located heat dissipating element 33 is made of a thermally conductive metal. A surface of the front-located heat dissipating element 33 can be coated with a radiating heat dissipating material to achieve the effects of radiatively dissipating heat. The front-located heat dissipating element 33 further includes a plurality of sub-structures for increasing a heat dissipation area. The sub-structures have a cross section of a columnar shape, a conical shape or any other shape, and the sub-structures are arranged in a parallel alignment or a radiating alignment. In the other hand, the sub-structures can be the rough surface on the front-located heat dissipating element 15 for increasing a heat dissipation area. The rough surface is made by a sand blasting method.

The air flow generating element 34 is arranged at the first air passage 312 of the rear-located heat dissipating element 31 to drive the air to flow through the first air passage 312, the second air passage 321 and the hole 332. The air flow generating element 34 is generally arranged in a passage opening of the first air passage 312 at the bottom of the rear-located heat dissipating element 31 for increasing the air flowing into the first air passage 312. The air flow generating element 34 can be a fan.

The heat generated from the light emitting element 13 of the light source generating element is conducted to the rear-located heat dissipating element 31, and the rear-located heat dissipating element 31 conducts heat to the front-located heat dissipating element 33 through the thermally conductive mounting element 32 for heat dissipation. The arrows shown in the figure indicate the air flowing through the first air passage 312, the second air passage 321 and the hole 332 for heat dissipation. The light source utility 3 having a heat dissipating structure can achieve the effects of dissipating heat rapidly and effectively reducing the volume of the of a light source utility, so as to overcome the drawbacks of the prior art.

Figure 10:
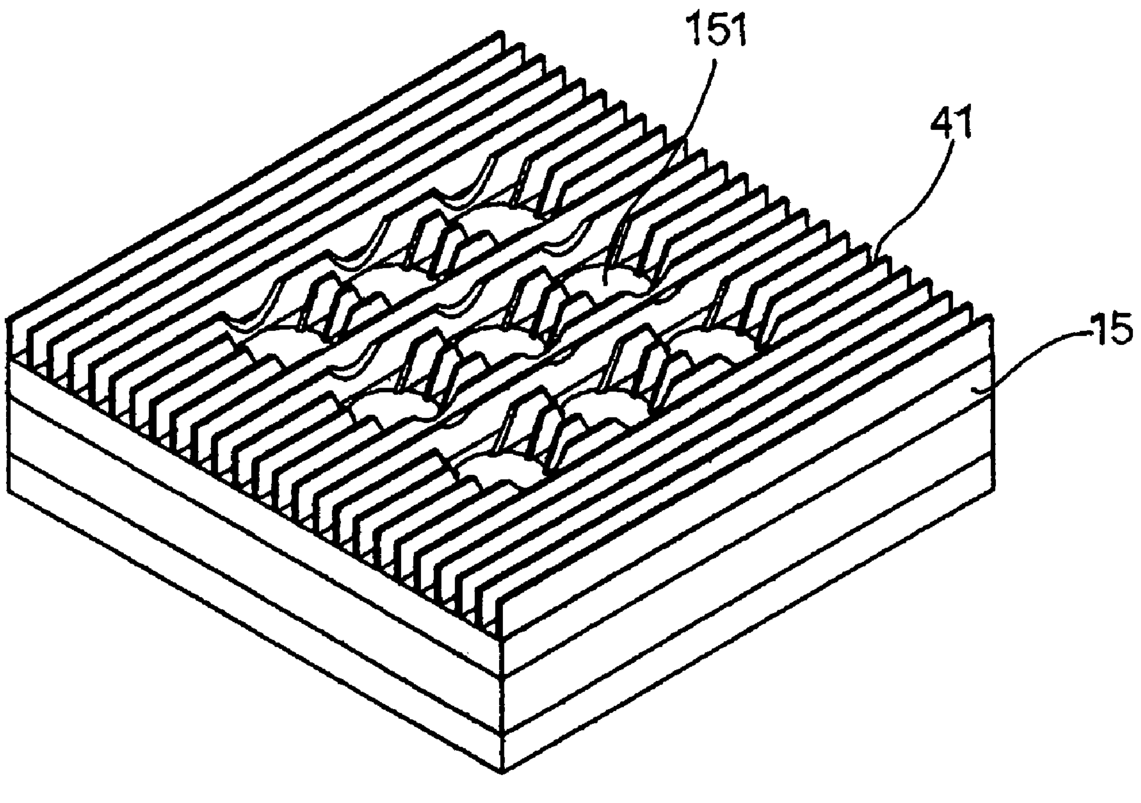
FIG. 10 is a perspective view of a heat dissipating structure of a light source utility in accordance with a fourth preferred embodiment of the present invention.

Referring to FIG. 10 for a perspective view of a heat dissipating structure of light source utility of the present invention, the heat dissipating structure of a light source utility 4 is substantially the same as those illustrated in FIGS. 1 to 3. The light source utility 4 also comprises a rear-located heat dissipating element 11, a light source generating element, a thermally conductive mounting element 14 and a front-located heat dissipating element 15. The difference resides on that the front-located heat dissipating element 15 of the light source utility 4 has a plurality of sub-structures 41 having a cross section in a columnar shape. The sub-structures 41 can increase the heat dissipating area of the front-located heat dissipating element 15, and the cross section of the sub-substructure 41 can be in a conical shape or any other shape, and the sub-structures are arranged in a parallel alignment or a radiating alignment. The sub-structures can be the rough surface on the front-located heat dissipating element 15 for increasing a heat dissipation area. The rough surface is made by a sand blasting method. The present invention can be applied in different designs as needed.

Figure 11:
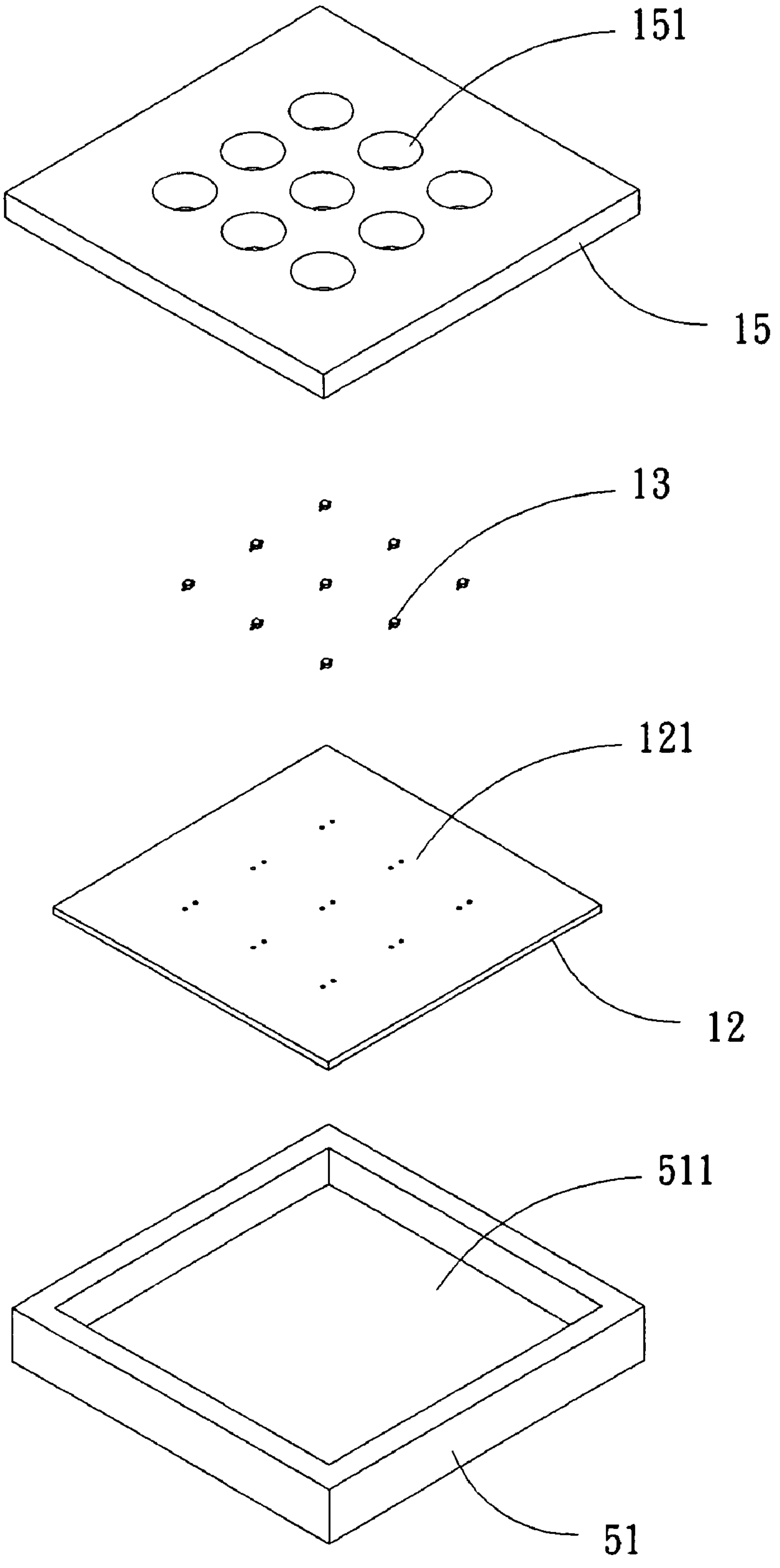
FIG. 11 is an exploded view of a heat dissipating structure of light source utility in accordance with the present invention.
Figure 12:
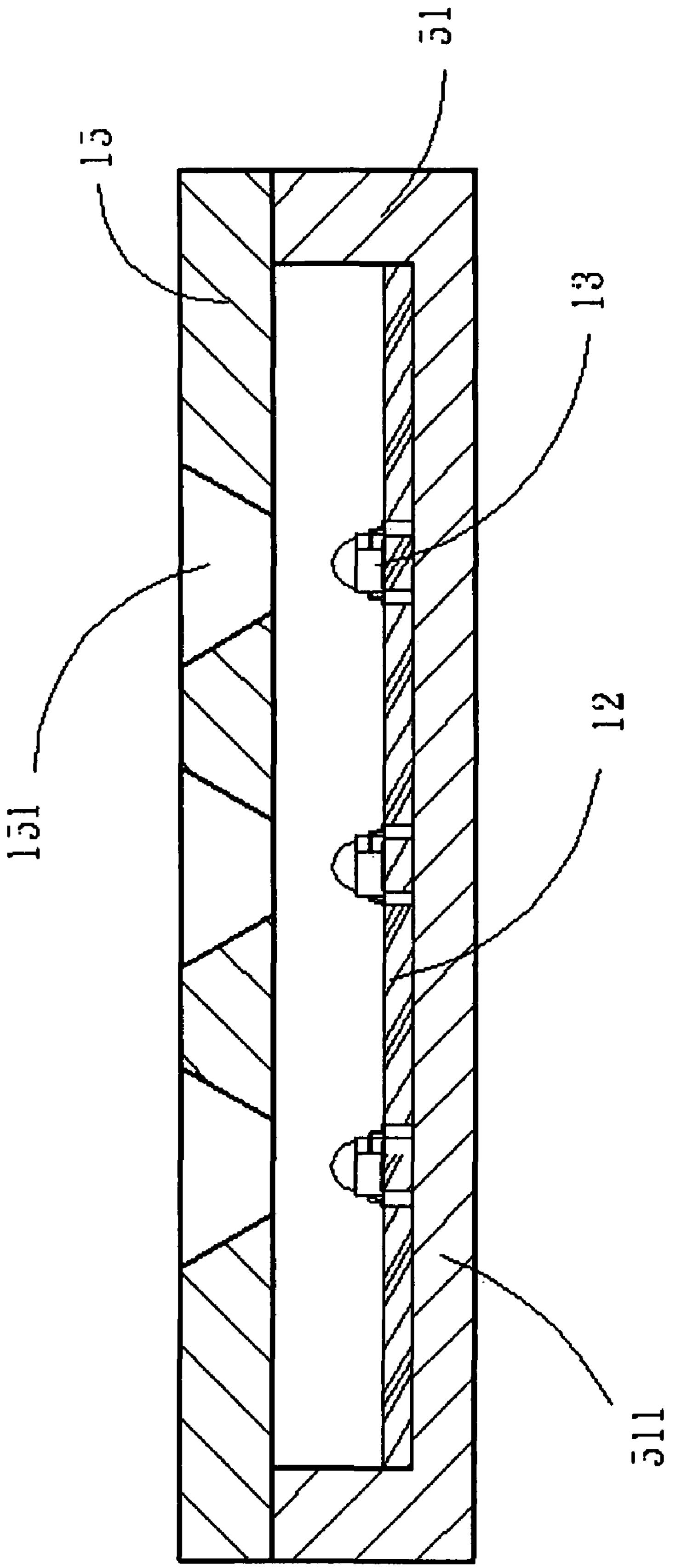
FIG. 12 is a cross-sectional view of a heat dissipating structure of light source utility in accordance with the present invention.

Referring to FIGS. 11 and 12 for an exploded view and a cross-sectional view of a heat dissipating structure of a light source utility in accordance with the present invention, the heat dissipating structure of the light source utility 5 comprises a rear-located heat dissipating element and a thermally conductive mounting element integrated into a heat dissipating element 51, a light source generating element and a front-located heat dissipating element 15.

The heat dissipating element 51 has a first surface 511 and the light source generating element is arranged on the first surface 511 of the rear-located heat dissipating element 51. The heat dissipating element 51 is made of a thermally conductive metal. A surface of the rear-located heat dissipating element 11 can be coated with a radiating heat dissipating material to achieve the effects of radiatively dissipating heat.

The light source generating element comprises a circuit board 12 and at least one light emitting element 13. A circuitry 121 is formed on the circuit board 12 for driving the light emitting element 13, or the light emitting element 13 is built directly on the first surface 511 having the circuitry 121. The light emitting element 13 can be a DC light emitting diode, an AC light emitting diode, a lamp tube or a light bulb.

The front-located heat dissipating element 15 is arranged on the heat dissipating element 51, and has at least one hole 151 corresponding to the light emitting element 13 for preventing a possible block of the light emitted from the light emitting element. 13. The front-located heat dissipating element 15 is made of a thermally conductive metal. A surface of the front-located heat dissipating element 15 can be coated with a radiating heat dissipating material to achieve the effects of radiatively dissipating heat. The front-located heat dissipating element 15 further has a plurality of sub-structures for increasing a heat dissipation area, and the sub-structures have a cross section in a columnar shape or a conical shape.

The heat generated from the light emitting element 13 is conducted to the heat dissipating element 51, and the heat dissipating element 51 conducts heat to the front-located heat dissipating element 15 for a heat dissipation, so as to constitute a light source utility 5 having a heat dissipating structure for achieving a quick heat dissipating effect and reducing the large volume of rear-located heat dissipating apparatus of the conventional light source utility. In addition to the integration of the rear-located heat dissipating element and thermally conductive mounting element into an assembly of the heat dissipating element, the thermally conductive mounting element and the front-located heat dissipating element can also be integrated into an assembly of another heat dissipating element.

Figure 13:
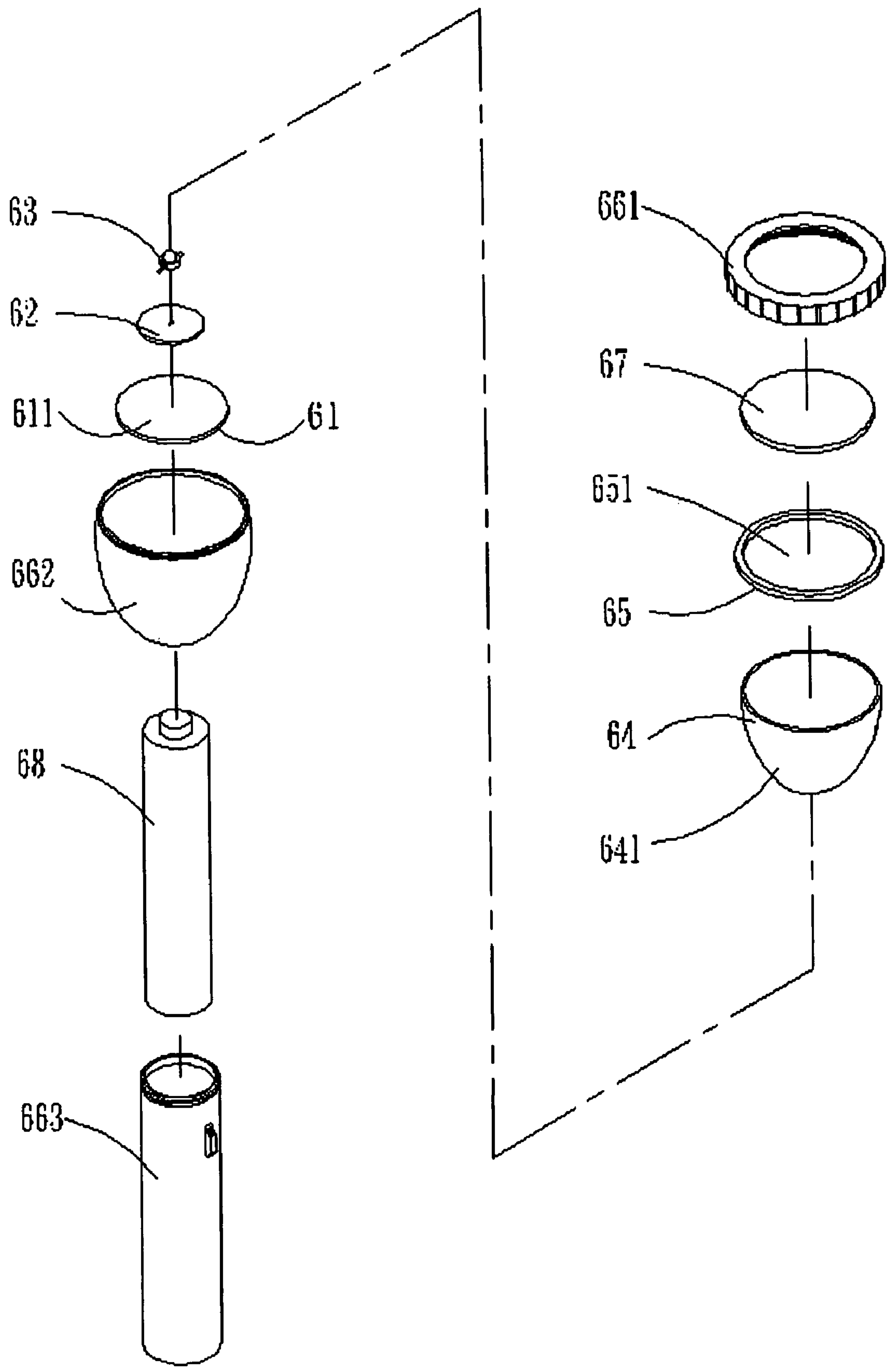
FIG. 13 is an exploded view of a preferred embodiment of the present invention being applied in a flashlight.
Figure 14:
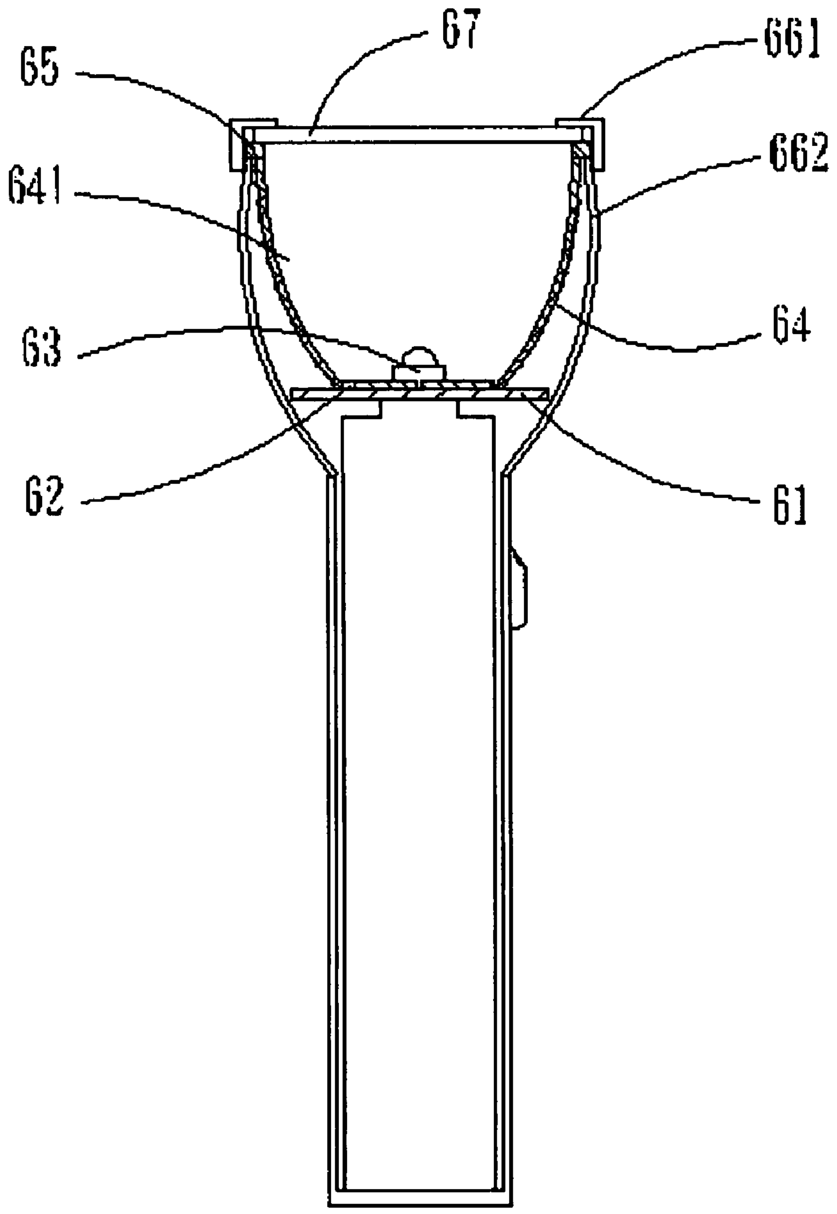
FIG. 14 is a cross-sectional view of a preferred embodiment of the present invention being applied in a flashlight.

Referring to FIGS. 13 and 14 for an exploded view and a cross-sectional view of a preferred embodiment of the present invention applied as a flashlight, the flashlight 6 comprises a rear-located heat sink 61, a circuit board 62, an LED 63, a heat conduction tube 64, a front-located heat dissipating ring 65, a flashlight casing, a lens 67 and a battery 68.

The rear-located heat sink 61 has a first surface 611, and the light source generating element is arranged on the first surface 611. The rear-located heat sink 61 is made of a thermally conductive metal. A surface of the rear-located heat sink 61 can be coated with a radiating heat dissipating material to achieve the effects of radiatively dissipating heat.

The light source generating element comprises a circuit board 62 and a LED 63. The electrode contact point is formed on the circuit board 62 to drive the LED 63, or the LED 63 is directly arranged on the first surface 611 having the electrode contact point. The LED 63 can be a DC light emitting diode, an AC light emitting diode, a lamp tube or a light bulb.

The heat conduction tube 64 is arranged around the circuit board 62 of the light source generating element on the first surface 611 of the rear-located heat sink 61. The internal lateral side of the heat conduction tube 64 forms a reflective surface 641 for reflecting the light emitted from the LED 63. The heat conduction tube 64 is made of a thermally conductive metal. A surface of the heat conduction tube 64 can be coated with a radiating heat dissipating material to achieve the effects of radiatively dissipating heat.

The front-located heat dissipating ring 65 is arranged on the heat conduction tube 64 and has a hole 651 corresponding to the LED 63 for preventing a possible block of the light emitted from the LED 63. The periphery of the hole 651 has a concave edge for latching the lens 67. The front-located heat dissipating ring 65 is made of a thermally conductive metal. A surface of the front-located heat dissipating ring 65 can be coated with a radiating heat dissipating material to achieve the effects of radiatively dissipating heat. The front-located heat dissipating ring 65 further comprises a plurality of sub-structures for increasing a heat dissipation area, and the sub-structures have a cross section of a columnar shape or a conical shape.

The lens 67 is arranged in the hole 651 of the front-located heat dissipating ring 65 and latched with the concave edge.

The battery 68 provides the electric power for the LED 63 to emit light.

The flashlight casing includes a fixing ring 661, a lamp holder 662 and a battery compartment 663. The lamp holder 662 contains a rear-located heat sink 61, a circuit board 62, an LED 63, a heat conduction tube 64, a front-located heat dissipating ring 65 and a lens 67, and then the fixing ring 661 and the lamp holder 662 are secured to the aforementioned components. The battery compartment 663 contains the battery 68 and is latched to the lamp holder 662. The fixing ring 661 and the lamp holder 662 are made of a thermally conductive metal for assisting the heat dissipation.

The heat generated from the LED 63 is conducted to the rear-located heat sink 61, and then conducted from the rear-located heat sink 61 to the front-located heat dissipating ring 65 through the heat conduction tube 64 for heat dissipation. With the foregoing components, the flashlight 6 having a heat dissipating structure is produced to achieve a quick heat dissipating effect and overcome the drawbacks of a conventional rear-located heat dissipating apparatus.

Figure 15:
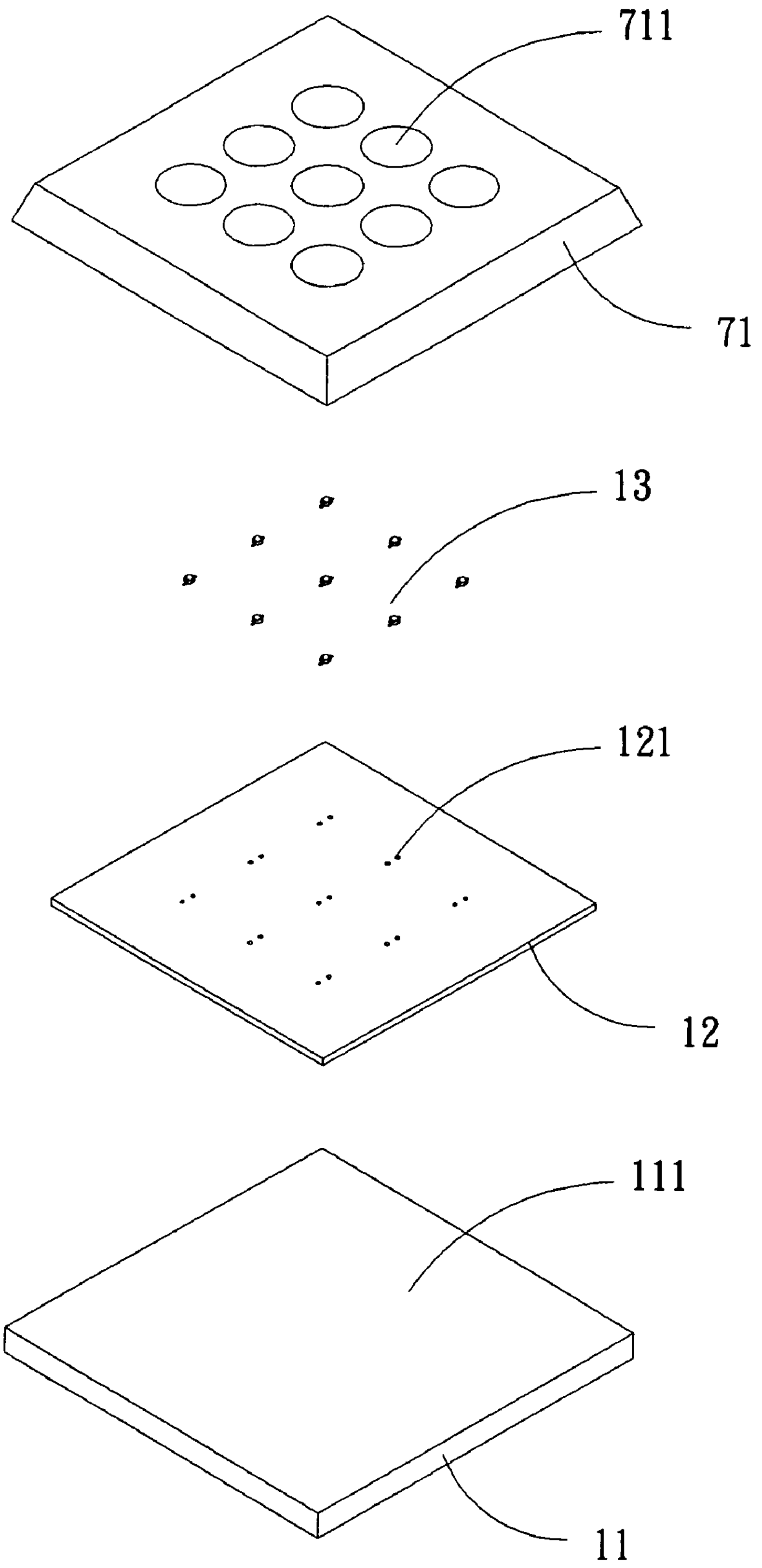
FIG. 15 is an exploded view of a heat dissipating structure of a light source utility of the present invention.
Figure 16:
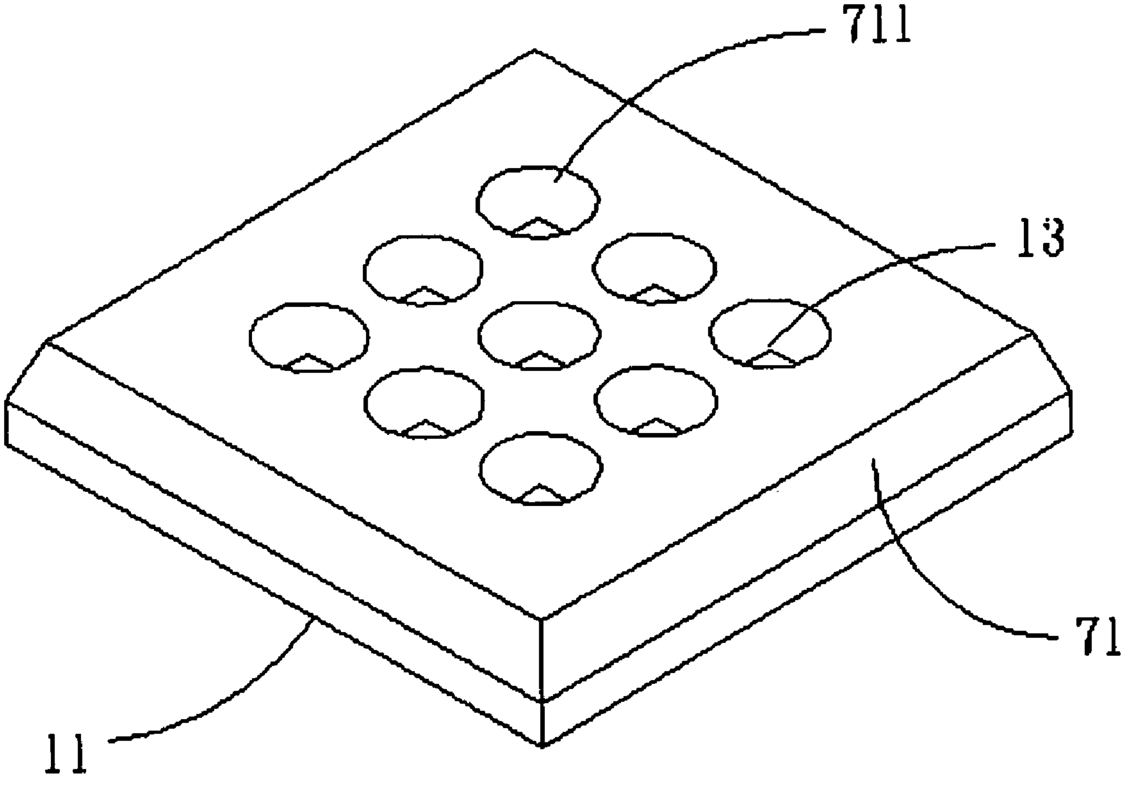
FIG. 16 is a perspective view of a heat dissipating structure of a light source utility of the present invention.
Figure 17:
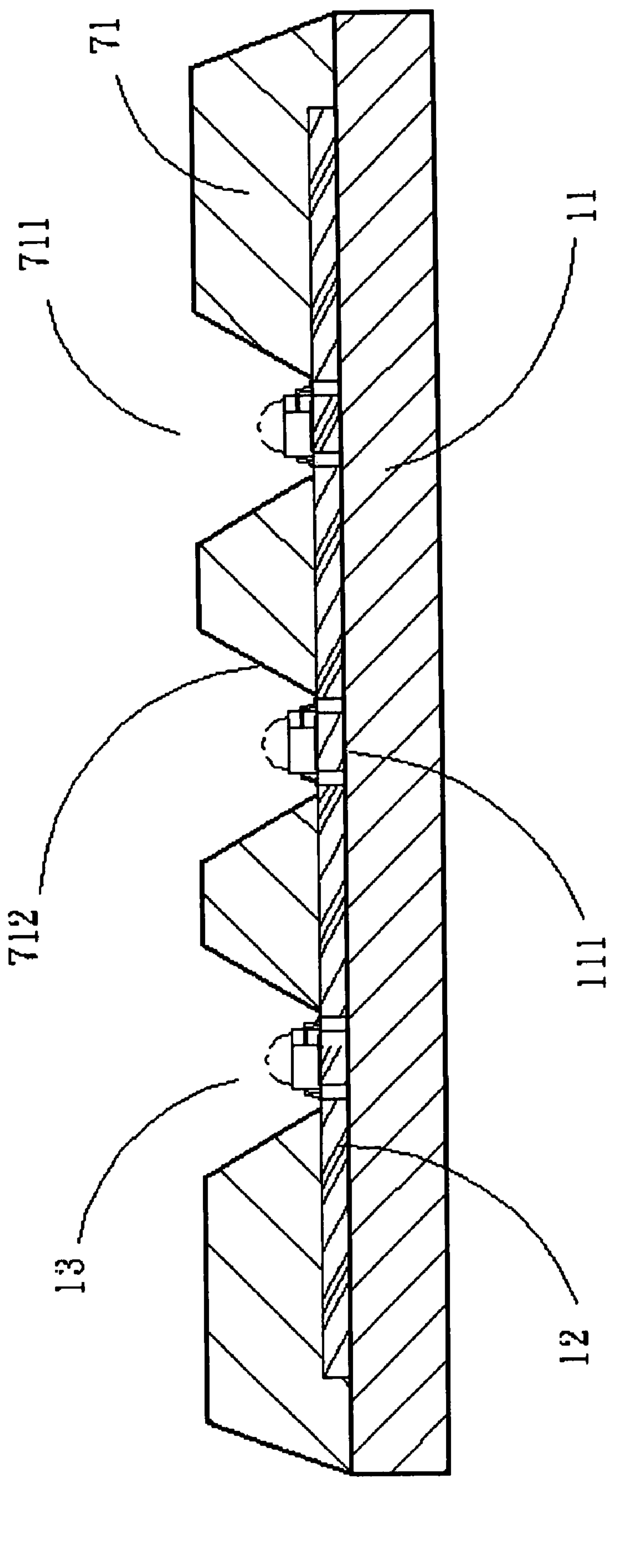
FIG. 17 is a cross-sectional view of a heat dissipating structure of a light source utility of the present invention.

Referring to FIGS. 15 to 17 for an exploded view, a perspective view and a cross-sectional view of light source utility having a heat dissipating structure in accordance with the present invention respectively, the light source utility 7 comprises a rear-located heat dissipating element 11, a light source generating element and a front-located heat dissipating element 71.

The rear-located heat dissipating element 11 has a first surface 111, and the light source generating element is arranged on the first surface 111. The rear-located heat dissipating element 11 is made of a thermally conductive metal. A surface of the rear-located heat dissipating element 11 can be coated with a radiating heat dissipating material to achieve the effects of radiatively dissipating heat.

The light source generating element comprises a circuit board 12 and at least one light emitting element 13. A circuitry 121 is formed on the circuit board 12 for driving the light emitting element 13, or the light emitting element 13 is built directly on the first surface 111 having the circuitry 121. The light emitting element 13 can be a DC light emitting diode, an AC light emitting diode, a lamp tube or a light bulb.

The periphery of the front-located heat dissipating element 71 is bent to an angle downward and contacted with the first surface 111 of the rear-located heat dissipating element 11. The front-located heat dissipating element 71 has at least one hole 711 corresponding to the light emitting element 13 for preventing a possible block of the light emitted from the light emitting element 13. In the meantime, a reflective surface is formed at the periphery of the hole 711 for reflecting the light emitted from the light emitting element 13. The front-located heat dissipating element 71 is made of a thermally conductive metal. A surface of the front-located heat dissipating element

71 can be coated with a radiating heat dissipating material to achieve the effects of radiatively dissipating heat. The front-located heat dissipating element 71 further has a plurality of sub-structures for increasing a heat dissipation area, and the sub-structures have a cross section of a columnar shape, a conical shape or any other shape, and the sub-structures are arranged in a parallel alignment or a radiating alignment. In the other hand, the sub-structures can be the rough surface of the front-located heat dissipating element 71 for increasing a heat dissipation area. The rough surface is made by a sand blasting method.

The heat generated from the light emitting element 13 is conducted to the rear-located heat dissipating element 11, and the rear-located heat dissipating element 11 conducts heat to the front-located heat dissipating element 71 for heat dissipation. With the foregoing components, a light source utility 7 having a heat dissipating structure is produced to achieve a quick heat dissipating effect and reduce the large volume of a conventional heat dissipating apparatus of a light source utility.

In summation of the description above, the present invention enhance the prior art and also complies with the patent application requirements. The description and its accompanied drawings are used for describing preferred embodiments of the present invention, and it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A heat dissipating structure of light source utility, comprising:

a rear-located heat dissipating element, having a first surface;

a light source generating element, disposed directly on said first surface;

a thermally conductive mounting element, disposed on said first surface, surrounding and contacting each lateral side of said light source generating element; and a front-located heat dissipating element, disposed on said thermally conductive mounting element, and having at least one hole corresponding to said light source generating element;

wherein the heat generated from said light source generating element is conducted to said rear-located heat dissipating element, and said rear-located heat dissipating element conducts heat from said thermally conductive mounting element to said front-located heat dissipating element for heat dissipation.

2. The heat dissipating structure of light source utility of claim 1, wherein said front-located heat dissipating element includes a plurality of sub-structures for increasing a heat dissipation area.

3. The heat dissipating structure of light source utility of claim 2, wherein said sub-structures have a cross section of a columnar shape, a conical shape or any other shape, and said sub-structures are arranged in a parallel alignment or a radiating alignment.

4. The heat dissipating structure of light source utility of claim 2, wherein said sub-structures are the rough surface on said front-located heat dissipating element and said rough surface is made by a sand blasting method.

5. The heat dissipating structure of light source utility of claim 1, wherein said rear-located heat dissipating element, said thermally conductive mounting element and said front-located heat dissipating element are made of a thermally conductive metal.

6. The heat dissipating structure of light source utility of claim 1, wherein said rear-located heat dissipating element, said thermally conductive mounting element and said front-located heat dissipating element have a surface coated with a radiating heat dissipating material for radiatively dissipating heat.

7. The heat dissipating structure of light source utility of claim 1, wherein said light source generating element comprises a circuit board and at least one light emitting element, and a circuitry is formed on said circuit board for driving said light emitting element, or said light emitting element is built directly on said first surface having said circuitry.

8. The heat dissipating structure of light source utility of claim 7, wherein said light emitting element is a DC light emitting diode, an AC light emitting diode, a lamp tube or a light bulb.

9. The heat dissipating structure of light source utility of claim 1, wherein said rear-located heat dissipating element and said thermally conductive mounting element are integrally formed.

10. The heat dissipating structure of light source utility of claim 1, wherein said thermally conductive mounting element and said front-located heat dissipating element are integrally formed.

11. The heat dissipating structure of light source utility of claim 1, wherein said thermally conductive mounting element is a reflector.

* * * * *